United States Patent [19]
DiLorenzo et al.

[11] 4,104,672
[45] Aug. 1, 1978

[54] HIGH POWER GALLIUM ARSENIDE SCHOTTKY BARRIER FIELD EFFECT TRANSISTOR

[75] Inventors: James Vincent DiLorenzo, Piscataway; Gerard Edward Mahoney, Branchburg; Joseph Michael Moran, Berkeley Heights, all of N.J.

[73] Assignee: Bell Telephone Laboratories, Incorporated, Murray Hill, N.J.

[21] Appl. No.: 736,731

[22] Filed: Oct. 29, 1976

[51] Int. Cl.² ............... H01L 29/80; H01L 29/48; H01L 29/56
[52] U.S. Cl. ......................... 357/22; 357/15; 357/68; 357/71
[58] Field of Search ............. 357/15, 22, 23, 68, 357/71

[56] References Cited
U.S. PATENT DOCUMENTS

| | | |
|---|---|---|
| 3,737,743 | 6/1973 | Goronkin et al. ............. 357/22 |
| 3,813,585 | 5/1974 | Tarui et al. .................. 357/22 |
| 3,855,613 | 12/1974 | Napoli et al. ................ 357/22 |
| 3,969,745 | 7/1976 | Blocker ....................... 357/22 |
| 3,988,619 | 10/1976 | Malaviva et al. ............. 357/22 |
| 4,015,278 | 3/1977 | Fukuta ........................ 357/22 |
| 4,016,643 | 4/1977 | Pucel et al. ................. 357/22 |

OTHER PUBLICATIONS

GaAs Microwave Power FET; by Fukuta et al., IEEE Transaction, vol. Ed. 23, No. 4, Apr., 1976, pp. 388-394.

Primary Examiner—Andrew J. James
Attorney, Agent, or Firm—Lucian C. Canepa

[57] ABSTRACT

An integrated high-power gallium arsenide field-effect-transistor device for operation in the gigahertz range comprises a multiple-gate structure. The device, which features gate cross-under fingers, is fabricated in microminiature form by directly processing a wafer using electron-beam lithographic techniques.

4 Claims, 12 Drawing Figures

FIG. 5
FIG. 12
FIG. 6
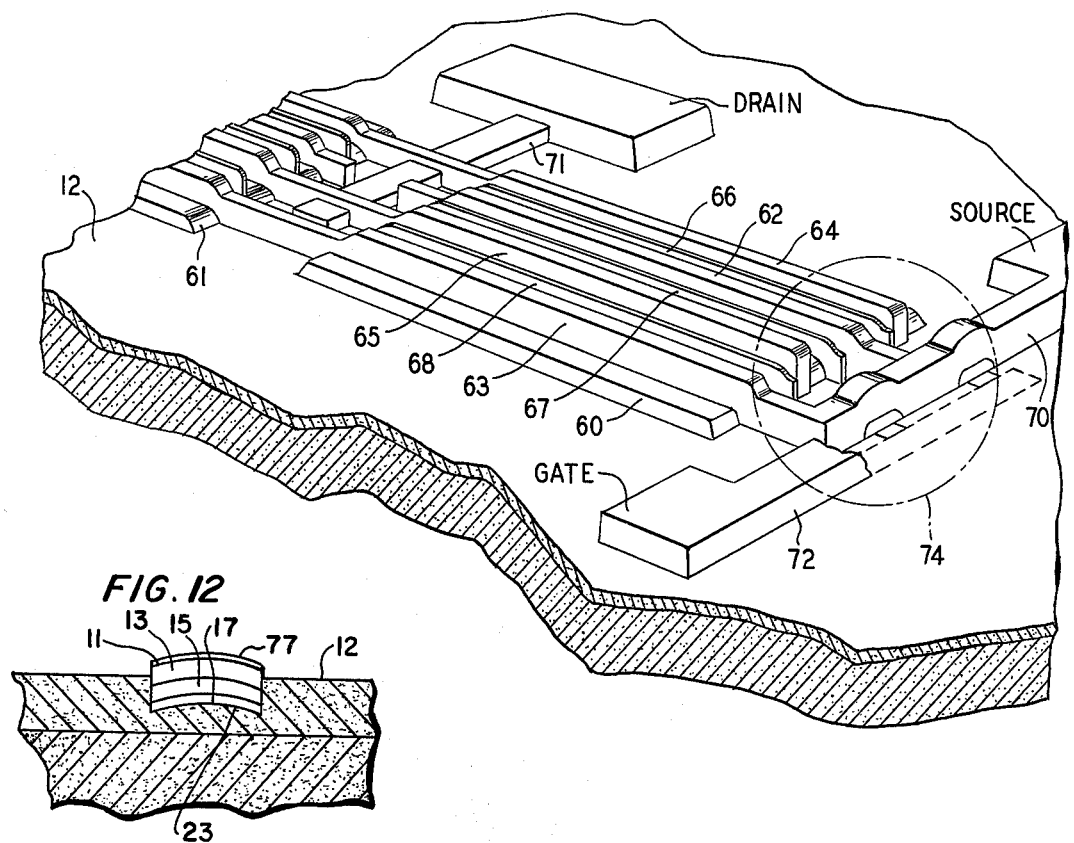
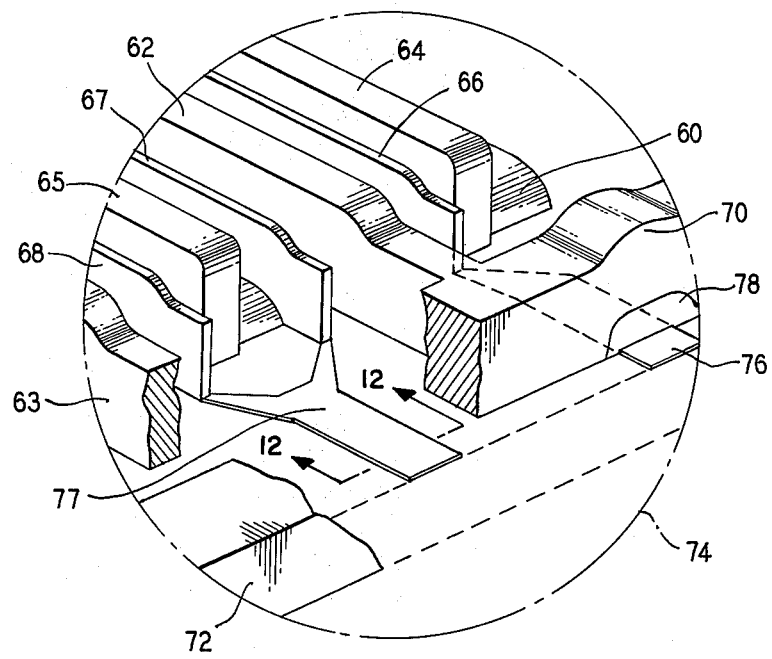

HIGH POWER GALLIUM ARSENIDE SCHOTTKY BARRIER FIELD EFFECT TRANSISTOR

BACKGROUND OF THE INVENTION

This invention relates to relatively high-power solid-state devices for operation in the gigahertz range and, more particularly, to high-power gallium arsenide (GaAs) Schottky barrier field-effect-transistor (FET) devices.

Considerable effort is currently underway directed at fabricating solid-state devices capable of providing 1 to 5 watts of saturated power in the 4 to 6 GHz range. Such devices are intended, for example, to replace traveling wave tubes and Morton triodes in high-frequency communication systems.

GaAs Schottky barrier units having multiple gates have been demonstrated to be capable of meeting the aforespecified power requirements in the indicated frequency range. Moreover, it was recognized that if such multiple-gate units could be fabricated in integrated form by a direct processing sequence based on electron lithography, units characterized by high reliability and low cost might be thereby realized.

SUMMARY OF THE INVENTION

Accordingly, an object of the present invention is an integrated layout for a solid-state device of the multiple-gate GaAs Schottky barrier type and an advantageous fabrication sequence therefor based on electron-beam lithographic techniques.

Briefly, this and other objects of the present invention are realized in a specific illustrative embodiment thereof that comprises an integrated multiple-gate GaAs Schottky barrier FET device including gate cross-under members. These members, as well as all the other constituent elements of the integrated device, are made in a particularly advantageous way in accordance with a unique fabrication sequence based on electron lithography.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which:

FIG. 5 depicts a simplified version of one of the mesa regions of FIG. 4;

FIG. 6 is an enlarged view of an encircled portion of the FIG. 5 arrangement;

and FIG. 12 is a cross-sectional sideview of the particular portion of FIG. 6 indicated by reference lines 12.

DETAILED DESCRIPTION

Figure 1:
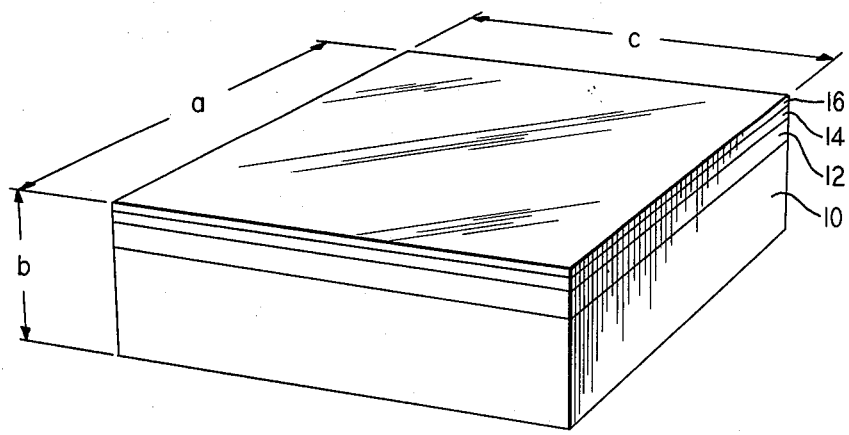
FIG. 1 is a view of a specific illustrative GaAs wafer of the type utilized to form a single device made in accordance with the principles of the present invention.

FIG. 1 represents a specific illustrative GaAs wafer of the type to be processed in accordance with the principles of the present invention to form an FET device. In practice, it is advantageous to fabricate plural identical such devices on a single wafer and subsequently to separate the wafer into individual chips each including a single multiple-gate FET device. But herein, for illustrative purposes only and so as not to unduly clutter the drawing, emphasis will be directed simply to making a single multiple-gate device on the wafer of FIG. 1.

The wafer shown in FIG. 1 includes a substrate 10 that comprises, for example, chromium-doped semi-insulating GaAs material having a resistivity greater than about $10^7$ ohm-centimeters. An N-type semi-insulating buffer layer 12 having a thickness between 3 and 10 micrometers and a doping concentration of less than $10^{13}$ atoms per cubic centimeter is epitaxially grown on the substrate 10. In turn, an N-type active layer 14 having a thickness of about 0.55 micrometers is epitaxially grown on the buffer layer 12. The doping concentration of the active layer 14 is, for example, approximately $5 \times 10^{16}$ atoms per cubic centimeter.

In some cases of practical interest, it is advantageous to add another epitaxial layer, designated 16 in FIG. 1, to the depicted wafer. Illustratively, the layer 16 comprises an N+ region about 1500 Angstrom units thick having a doping concentration of approximately $2 \times 10^{18}$ atoms per cubic centimeter.

The overall dimensions $a$, $b$, and $c$ (FIG. 1) of one particular wafer that was processed as specified herein to form a GaAs FET device were 20, 0.375 and 20 millimeters, respectively.

In accordance with one aspect of the principles of the present invention, the wafer shown in FIG. 1 is directly processed by a series of electron-beam lithographic steps to form a GaAs FET device. A particularly advantageous apparatus with which to carry out these steps is described in U.S. Pat. No. 3,900,737, issued Aug. 19, 1975 to R. J. Collier and D. R. Herriott, entitled "Electron Beam Exposure System." With such a computer-controlled system, it is feasible to precisely delineate the successive patterns required for such FET devices. Feature dimensions of only a few micrometers or less and alignment tolerances less than one micrometer are thereby achievable.

It is, of course, essential that the successive patterns formed by electron lithography on a resist-coated FIG. 1-type wafer be accurately registered with respect to each other. Pattern registration is achieved, for example, by determining the locations of three fiducial marks formed on the wafer. Illustratively, each mark comprises a cross 128 micrometers in length with 22-micrometer-wide side arms. By scanning the marks with an electron beam, the position of each cross can be determined with a maximum error of ±0.25 micrometers. The positional information so obtained is then used to calculate the translation, rotation, skew and magnification required to get the best fit between successive patterns.

In an electron beam exposure system in which fiducial marks are used for pattern registration, loss or deterioration of the marks during processing could be disastrous. It is necessary, therefore, that the marks not only provide a strong signal in response to electron beam scanning thereof but that they survive all processing steps. In practice, raised crosses of GaAs with a minimum height of 0.7 micrometers have been found to satisfy both requirements. Moreover, to minimize degradation of these marks during the fabrication sequence, the electron resist material overlying the marks is purposely maintained in place as a protective layer during successive processing steps, as specified later below.

A specific illustrative procedure for forming fiducial marks on the wafer of FIG. 1 involves first coating the top surface of the depicted wafer with a layer of a suitable negative electron resist material. (An advantageous such material is polyglycidyl methacrylate-co-ethyl acrylate which will be designated hereinafter as COP. A description of COP is contained in an article by L. F. Thompson, J. P. Ballantyne and E. D. Feit, entitled "Molecular Parameters and Lithographic Performance of Polyglycidyl Methacrylate-co-Ethyl Acrylate: A Negative Electron Resist," *J. Vac. Sci. Tech.* 12, pages 1280–1283, 1975. For purposes of a particular example, it will be assumed hereinbelow that in every case the electron resist material to be patterned is COP.) Three square spaced-apart reference portions of the resist layer are then irradiated with the electron beam of the aforespecified exposure system. By conventional techniques, all the unexposed portions of the resist layer are then removed. The COP squares that remain on the wafer serve as intermediate alignment marks.

Ion milling is an advantageous technique for forming the aforedescribed fiducial marks (crosses) in the GaAs wafer of FIG. 1. But, since satisfactory ion-milling-resistant electron resists are not presently available, neither COP nor any other electron resist can be used directly to mask selected portions of the wafer surface during ion milling. Accordingly, the wafer surface with its three COP intermediate alignment marks is next coated with a suitable ion-milling-resistant material such as a standard positive photoresist. Subsequently, by utilizing an associated mask structure and a standard contact printer, particular regions of the positive photoresist are selectively exposed to ultraviolet light.

The noted mask structure is accurately positioned relative to the GaAs wafer by utilizing the aforementioned COP alignment marks as reference areas against which the fiducial crosses are to be butted. The positive photoresist is then sleectively exposed and developed to cover the entire top surface of the wafer except for three window areas in the center of each of which is a cross of photoresist. The top surface of the wafer is then ion milled. The GaAs that is not protected by photoresist is thereby milled away, leaving raised fiducial crosses having vertical side walls and well-defined edges. The photoresist is then removed from the top surface of the wafer.

It is noted that the aforedescribed technique for forming fiducial marks is the only part of the overall processing sequence described herein that employs photolithography. Electron-beam lithographic techniques will be specified exclusively hereinafter.

Figure 2:
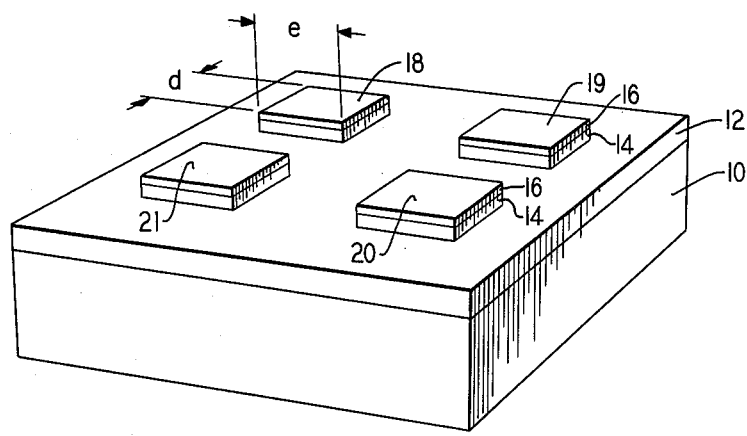
FIG. 2 shows the FIG. 1 wafer processed to form four mesas thereon.

Electrical isolation among several of the constituent parts of the particular FET device to be fabricated from the FIG. 1 wafer is achieved by forming elevated islands or mesas in the epitaxial layers of the wafer. The mesas are made by selectively removing corresponding portions of the layers 16 and 14 and corresponding surface portions of the buffer layer 12. As a result, the regions surrounding the elevated mesas exhibit a semi-insulating characteristic. Advantageously, the side walls of the mesas are fabricated to be sloped rather than vertical. As a result, metallic members that extend from the mesas onto the surrounding semi-insulating region are in practice characterized by reliable step coverage of the edges of the mesas. Four such mesas 18 through 21 are schematically represented in FIG. 2. Illustratively, the depicted mesas are identical to each other, and the dimensions $d$ and $e$ are approximately 250 micrometers and 190 micrometers, respectively.

The mesa fabrication sequence is initiated by coating the entire top surface of the FIG. 1 wafer with a 5000-Angstrom-unit thick layer of silicon dioxide. (This and all other silicon dioxide layers specified herein will be assumed to be applied by a standard chemical vapor deposition step.) Next, a layer of COP (for example 0.7 micrometers thick) is deposited on the silicon dioxide. Only the region of the COP that overlie the three above-noted fiducial marks and the four mesas to be formed are then irradiated by means of the aforespecified electron beam system. (Hereinafter it will be assumed that in each irradiation step the fiducial marks are so protected.) After removing the unexposed COP, the uncovered silicon dioxide is removed in a plasma etching step that involves placing the wafer within the radio-frequency shield of a standard plasma etching apparatus. Etching takes place in a plasma that comprises, for example, carbon tetrafluoride and 4 percent oxygen (hereinafter referred to as $CF_4$ plasma etching). As is well known, the etch rate may be controlled by varying the amount of oxygen between 0 and about 10 percent.

Next, after stripping the exposed COP in, for example, a pure-oxygen plasma etching step (hereinafter referred to as $O_2$ plasma etching) the uncovered regions of the epitaxial layers 14 and 16 are ion milled. During ion milling, the four islands of silicon dioxide serve as masks to protect the underlying epitaxial regions. Advantageously, the milling beam is directed at 45 degrees to the wafer surface and only about half of the total thickness of the layers 12, 14 and 16 to be eventually removed is initially milled away.

The entire top surface of the wafer is then recoated with COP and irradiated to expose slightly smaller islands directly overlying the four mesas of silicon dioxide. These exposed COP regions serve as masks for trimming the silicon dioxide islands in a subsequent $CF_4$ plasma etching step. The trimmed silicon dioxide portions then serve to mask the underlying regions of the wafer during a subsequent ion milling operation of the type specified above.

Figure 3:
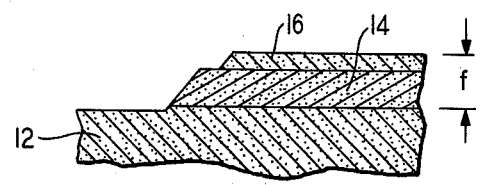
FIG. 3 illustrates the edge profile of the mesas.

Ion milling is continued until the unmasked portions of the layers 14 and 16 as well as an unmasked surface portion of the layer 12 have been removed. The result of the two-step ion milling operation is to leave four stair-case mesas on the surface of the GaAs wafer. The edge profile of one of these mesas is shown in FIG. 3. The distance $f$ in FIG. 3 approximates the sum of the thicknesses of the layers 14 and 16 shown in FIG. 1. As is evident in FIG. 3, ion milling has also removed surface portions of the buffer layer 12. Significantly, ion milling causes little or no trenching in the layer 12 immediately adjacent the mesas.

After removing the aforementioned silicon dioxide islands, with, for example, a standard hydrofluoric acid solution, a 5000-Angstrom-unit-thick layer of silicon dioxide is deposited on the entire top surface of the GaAs wafer. At that point, the wafer is ready to be processed to fabricate multiple source, drain and gate electrodes thereon. In turn, corresponding electrodes are connected together via bus bars to form a single multiple-gate structure. Before describing this process in detail, three views of a device of the type to be made will be described briefly.

Figure 4:
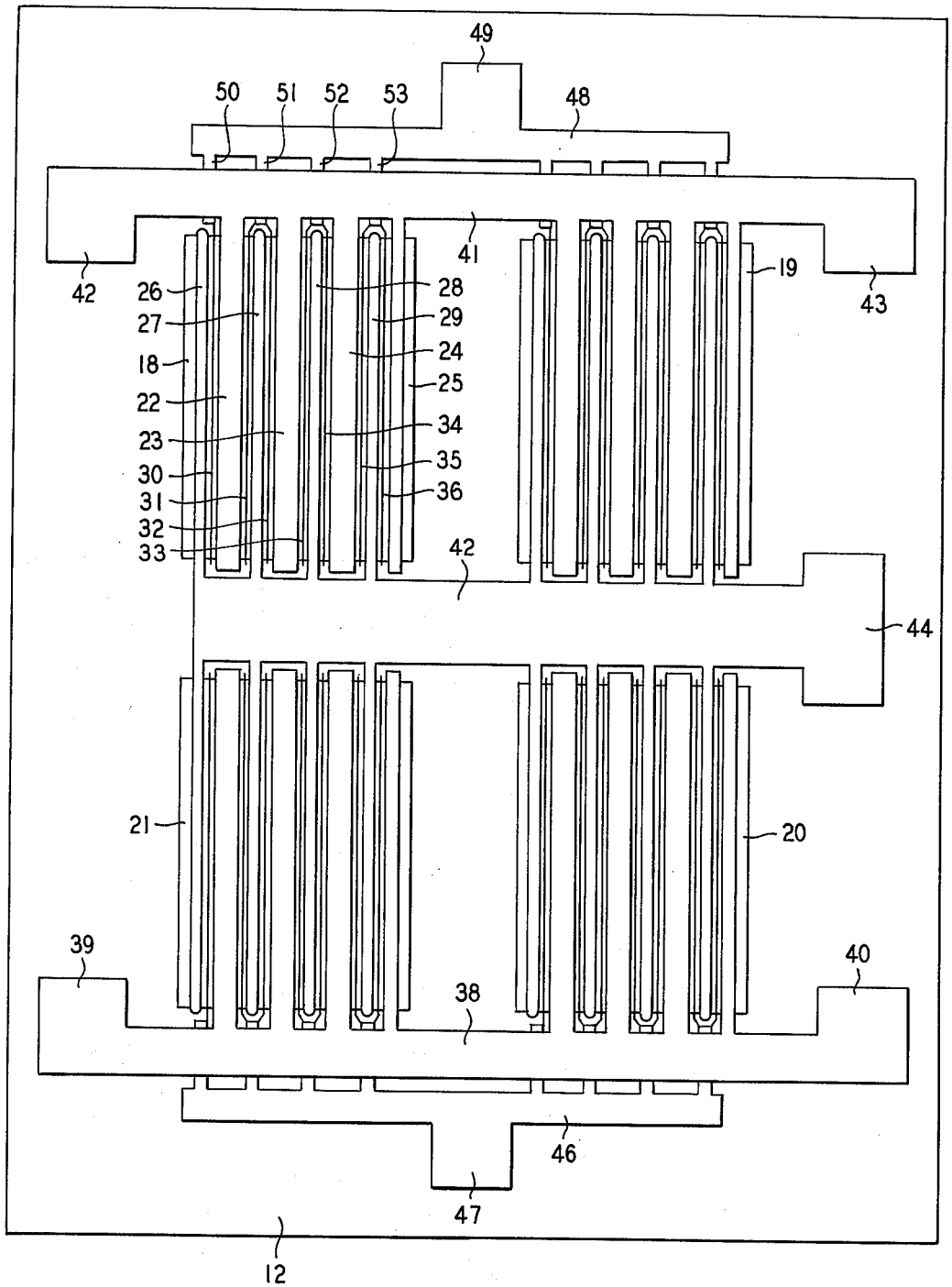
FIG. 4 is a top view of a specific illustrative multiple-gate structure fabricated on the four-mesa arrangement shown in FIG. 2.

FIG. 4 is a top view of a specific illustrative multiple-gate device made in accordance with the principles of the present invention. To indicate the correspondence between FIGS. 2 and 4, the FIG. 4 arrangement is also depicted as including four mesas designated 18 through 21. Each mesa includes thereon an interleaved array comprising four source stripes or electrodes, four drain stripes or electrodes and seven gate stripes or electrodes. Thus, for example, the mesa 18 is depicted in FIG. 4 as having thereon source electrodes 22 through 25, drain electrodes 26 through 29 and gate electrodes 30 through 36. As indicated in FIG. 4, the ends of all the electrodes extend beyond the edges of the mesas onto the semi-insulating material 12. In turn, the extremities of these electrodes are selectively connected together by means of a set of bus bars.

More specifically, the FIG. 4 arrangement includes source bus bars 38 and 41 which respectively terminate in bonding pads 39, 40 and 42, 43, drain bus bar 42 which terminates in bonding pad 44 and gate bus bars 46 and 48 which are formed integrally with bonding pads 47 and 49, respectively. The source bonding pads 39, 40, 42 and 43 of the FIG. 4 device are intended to be electrically connected to a single source terminal (not shown) in a final device assembly. Similarly, the drain bonding pad 44 is intended to be electrically connected to a single external drain terminal, and the gate bonding pads 47 and 49 are intended to be electrically connected to a single gate terminal.

In accordance with one aspect of the principles of the present invention, the specific illustrative device shown in FIG. 4 includes sixteen conductive members that connect the fourteen gate electrodes on the mesas 18 and 19 to the gate bus bar 48 and the fourteen gate electrodes on the mesas 20 and 21 to the gate bus bar 46. Thus, for example, the four members 50 through 53 associated with the mesa 18 respectively connect the gate electrodes 30, 31 and 32, 33 and 34, and 35 and 36 to the gate bus bar 48.

All of the aforespecified conductive connecting members extend under one or the other of the two conductive source bus bars 38 and 41. (The manner in which this is accomplished, in a way to insure reliable electrical isolation between overlying elements, will be specified later below.) It is significant that the gate stripes and their respective cross-under members carry the least amount of current of any of the electrodes included in the device. Accordingly, the cross-under members require for their fabrication the deposition of a minimum amount of metal. As a result, the problems associated with making the cross-over bus bars in a reliable way in a high-resolution microminiature GaAs FET device are thereby minimized.

In one particular FIG. 4 embodiment that was constructed, the dimensions and spacings of the source, drain and gate electrodes were as follows. Each of the drain stripes (for example the electrode 26) measured about 10 micrometers by 250 micrometers. Each of the gate stripes (for example the electrode 30) was about 2 micrometers by 250 micrometers. Each of the source stripes (for example the electrode 22), except for the rightmost source electrode on each of the mesas 18 through 21, measured about 20 micrometers by 250 micrometers. (Each of the rightmost source electrodes was about 10 micrometers by 250 micrometers.) The distance between gate electrodes having a source electrode therebetween (see, for example, the gate electrodes 30 and 31 on the mesa 18) was approximately 27 micrometers. The distance between gate electrodes having a drain electrode therebetween (see, for example, the gate electrodes 31 and 32) was about 17 micrometers. In addition, the source-to-drain spacing was about 7 micrometers, and the gate electrode was placed symmetrically in this spacing.

FIG. 5 is an isometric view of a simplified version of the FIG. 4 device. A simpler structure than the FIG. 4 one is shown so as not to unduly clutter the drawing. Extending the FIG. 5 arrangement to form the FIG. 4 device is apparent in view of the description herein. Only one complete mesa 60 and a portion of a second mesa 61 are shown in FIG. 5. Moreover, only two source electrodes, two drain electrodes and three gate electrodes are indicated as being included on each of the mesas. More specifically, source electrodes 62 and 63, drain electrodes 64 and 65 and gate electrodes 66 through 68 are included on the mesa 60. Also shown in FIG. 5 are source, drain and gate bus bars 70 through 72, respectively, each of which terminates in an enlarged region or bonding pad.

Dot-dash circle 74 in FIG. 5 encompasses a particular portion of the FIG. 5 device. An enlarged and partially broken-away version of the encircled portion is shown in FIG. 6.

Elements in the FIG. 6 enlargement that were previously specified above in connection with FIG. 5 are identified in FIG. 6 by the same reference numerals employed in FIG. 5. Thus, for example, FIG. 6 shows a portion of the mesa 60, the drain electrodes 64 and 65, the gate electrodes 66 through 68, the source electrodes 62 and 63, the source bus bar 70 and the gate bus bar 72.

Moreover, FIG. 6 clearly shows the manner in which the gate bus bar 72 is electrically connected to the gate electrodes 66 through 68. This is accomplished by metallic cross-under members 76 and 77. More specifically, the conductive member 76 interconnects the gate electrode 66 and the gate bus bar 72, whereas the conductive member 77 interconnects the gate electrodes 67 and 68 and the gate bus bar 72.

The metallic source bus bar 70 shown in FIGS. 5 and 6 crosses over the metallic members 76 and 77. As indicated in an enlarged way in FIG. 6, electrical isolation between the bus bar 70 and the underlying member 76 is achieved by interposing an insulating region 78 therebetween.

For purposes of simplification and so as not to unduly complicate the drawing, the processing sequence described hereinbelow will be schematically represented for a prototype single-gate device. In every respect the sequence to be described is applicable in a straightforward way to the fabrication of a multiple-gate arrangement of the type shown in FIG. 4 (or in FIGS. 5 and 6).

In the specific illustrative manner specified earlier above, a four-mesa structure (FIG. 2) is fabricated. The subsequent processing of that structure to form an interleaved array of electrodes on each of the mesas (FIG. 4) will be specified with respect to the simplified schematic representations shown in FIGS. 7 through 11.

Earlier above a 5000-Angstrom-unit-thick layer of silicon dioxide was specified as being deposited on the entire top surface of the four-mesa GaAs wafer illustrated in FIG. 2. Next, in accordance with the principles of the present invention, a layer of COP is deposited on the surface of the structure and then selectively irradiated to expose the entire top surface except where source and drain electrodes are to be formed. The unexposed COP is removed to leave a patterned COP mask that covers the silicon dioxide layer everywhere except where source and drain electrodes are to be located. In turn, the uncovered portions of the oxide layer are removed in a $CF_4$ plasma etching step to expose surface portions of the GaAs wafer. The COP mask portions are then removed in an $O_2$ plasma etching step.

To ensure good adherence of the source and drain electrodes to the GaAs surface, it is advantageous to etch the surface to a depth of about 500 Angstrom units with a 0.05 percent solution of bromine dissolved in methanol. To further ensure good adhesion, it is advantageous to maintain the GaAs surface at about at least 150° C. during the deposition thereon of the constituent metallic layers of the source and drain electrodes.

Illustratively, the first or bottom-most metallic layer of the source and drain electrodes comprises a mixture of germanium and gold (for example 12 percent germanium). This layer is designed to be about 400 Angstrom units thick.

The second layer of the metallization system that constitutes the source and drain electrodes is a so-called balling cap made of silver about 1000 Angstrom units thick. This serves to smooth over any spikes in the germanium-gold layer. Lastly, a 1000-Angstrom-unit-thick layer of a good conductor such as gold is deposited to protect the silver layer from oxidation.

Figure 7:
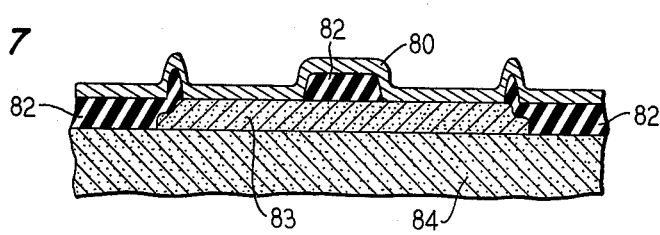
FIGS. 7 through 11 are simplified schematic representations of various stages in the fabrication of a device made in accordance with the principles of the present invention.

At that point in the fabrication sequence the device may be schematically represented in the simplified form shown in FIG. 7. Metallic layer 80 in FIG. 7 actually comprises three layers, as specified above. The silicon dioxide regions are designated by reference numerals 82. Also shown in FIG. 7 are a mesa 83 and a GaAs substrate member 84.

The silicon dioxide regions 82 (FIG. 7) are then removed by, for example, dipping the structure in hydrofluoric acid and subsequently spraying the surface with a substance such as acetone. In this way the regions 82 are undermined and removed, thereby carrying with them (or "lifting off") the overlying portions of the metallic layer 80. The resulting structure is shown in FIG. 8.

Figure 8:
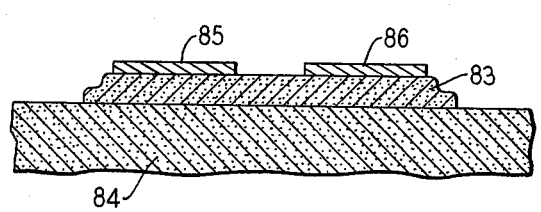

The mesa 83 of FIG. 8 includes thereon source and drain electrodes 85 and 86, respectively. Advantageously, good ohmic contact between these electrodes and the mesa is achieved in a so-called spike heating step in which the aforementioned germanium and gold constituents are alloyed. Illustratively, this is done by rapidly and momentarily heating the GaAs wafer to about 500° C.

In those device embodiments in which the topmost layer of the mesa 83 (FIG. 8) comprises an $N^+$ layer overlying the aforespecified active layer, the portions of the $N^+$ layer not covered by the source and drain electrodes are then removed. This is done, for example, by spray etching with $H_2O_2$ adjusted to a pH of about 7.0 with $NH_4OH$. (Hereinafter this will be referred to as a PA spray etching step.)

In a subsequent series of processing steps, the gate cross-under members (see, for example, elements 76 and 77 in FIG. 6) and the bottom portion of the gate bus bar (element 72 in FIG. 6) are fabricated. The major steps in this fabrication sequence are as follows. (Note that hereinbelow, as previously, standard and obvious steps such as baking the COP, cleaning and inspecting the wafer, etc., are not explicitly recited.)

1. Deposit a 5000-Angstrom-unit-thick layer of silicon dioxide on the entire top surface of the device.
2. Coat a 0.7-micrometer-thick layer of COP on the silicon dioxide.
3. With EBES, expose the entire surface of the COP layer except for those portions that overlie the regions on which the gate bus bar and the gate cross-under members are to be formed. Remove the unexposed COP.
4. With the patterned COP as a mask, remove the uncovered silicon dioxide in a $CF_4$ plasma etching step.
5. Remove the COP mask in an $O_2$ plasma etching step.
6. To enhance adhesion of the gate bus bar and cross-under members to the wafer surface, etch the exposed portions of the GaAs wafer to a depth of about 0.15 micrometers in the center of the etched region with a 0.05 percent solution of bromine dissolved in methanol. This forms convex-bottom trenches in the GaAs surface. The subsequent deposition of metal in such trenches, as specified below, forms rounded-top conductors having an advantageous profile.
7. With the wafer maintained at about 150° C., four layers of metal are deposited on the exposed portions of the GaAs surface (as well as on the silicon dioxide) in the following order: a 400-Angstrom-unit-thick layer 17 (see FIG. 12) of germanium/gold, a 1000-Angstrom-unit-thick layer 15 of silver, a 1000-Angstrom-unit-thick layer 13 of gold and a 200-Angstrom-unit-thick layer 11 of tungsten. (The tungsten serves as a glue film to ensure good adhesion to a silicon dioxide portion to be applied thereover.)
8. In a hydrofluoric acid etching step, the silicon dioxide and the metal thereon are lifted off the wafer, leaving on the device a metallic pattern definitive of the gate cross-under members and the bottom portion of the gate bus bar. (The aforespecified convex nature of the channels in which the noted four-layer metallic pattern is deposited is indicated by reference numeral 23 in FIG. 12).

In a next series of processing steps, the gate electrodes (see, for example, elements 30 through 36 in FIG. 4 or elements 66 through 68 in FIG. 6) are fabricated. The major steps in this fabrication sequence are as follows.

1. Deposit a 5000-Angstrom-unit-thick layer of silicon dioxide on the entire top surface of the device.
2. Coat a 0.6-micrometer-thick layer of COP on the silicon dioxide.
3. With EBES, expose the entire surface of the COP layer except for those portions that overlie the regions on which the gate electrodes are to be formed. In addition, it is advantageous to doubly expose those regions of the COP that overlie silicon dioxide portions that are intended to serve as cross-over insulators (see, for example, portion 78 in FIG. 6). Remove the unexposed COP.
4. With the patterned COP as a mask, remove the uncovered silicon dioxide in a $CF_4$ plasma etching step until surface portions of the GaAs mesa (the gate electrode portions) are revealed.
5. Remove the COP mask in an $O_2$ plasma etching step.

6. Clean thoroughly and rinse the exposed surface portions of the GaAs mesas. (Advantageously, this step includes a PA spray etching step.)
7. Evaporate a 1000-Angstrom-unit-thick layer of platinum over the entire top surface of the wafer thereby forming Schottky barriers in the exposed portions of the mesas. In practice, it is found that the platinum layer adheres very well to the underlying GaAs and much less well to the underlying silicon dioxide.
8. Spray off the unwanted platinum (that is, the platinum on the silicon dioxide) by, for example, mechanically abrading the top surface of the wafer by spraying it with a substance such as acetone. At that point in the fabrication process, the simplified device specified above appears as shown in FIG. 9.

Figure 9:
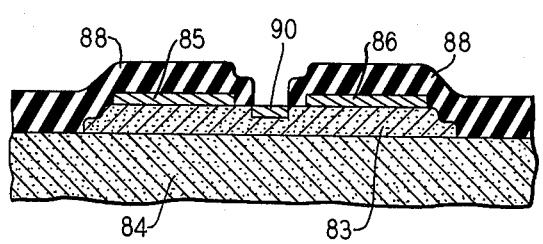

FIG. 9 shows the GaAs substrate member 84, the mesa 83, the source electrode 85 and the drain electrode 86, all of which were previously specified above in connection with FIG. 8. In addition, the FIG. 9 structure includes silicon dioxide regions 88 and Schottky barrier gate electrode 90.

The next sequence of steps in the herein-considered process is directed to fabricating a final metallization that is utilized to thicken previously deposited metals and to make the necessary interconnections between the source, drain and gate electrodes and their respective bus bars and bonding pads. The metals employed in this final sequence must adhere well to silicon dioxide as well as to the previously deposited metals. In practice, a sandwich of titanium, platinum and gold has been found to be satisfactory for this purpose, as specified in detail below.

It is advantageous to perform the final metal patterning by ion milling. In this connection, an advantageous ion milling mask has been determined to be a layer of titanium covered with a layer of silicon dioxide, as detailed below. The top silicon dioxide layer assures reliable masking in areas where the titanium does not step cover well.

Hence, in accordance with one aspect of the principles of the present invention, such a two-layer ion milling mask is placed on top of the aforespecified metallic sandwich. The silicon dioxide is patterned by $CF_4$ plasma etching using COP as a mask. The titanium is then etched in an $O_2$ plasma using $SiO_2$ as a mask. Ion milling of the gold and platinum layers is then carried out with the patterned titanium serving as a mask. The bottom layer of titanium serves as a milling stop as well as a glue layer to any underlying silicon dioxide. When the bottom titanium layer is reached, the silicon dioxide masking layer is removed by $CF_4$ plasma etching, and both titanium layers are then removed by etching with hydrofluoric acid.

Figure 10:
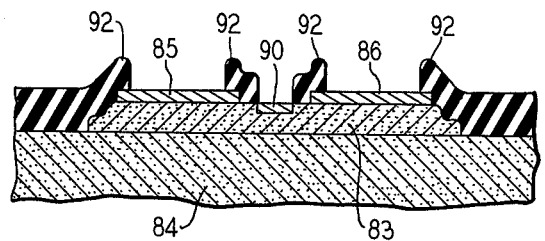
Figure 11:
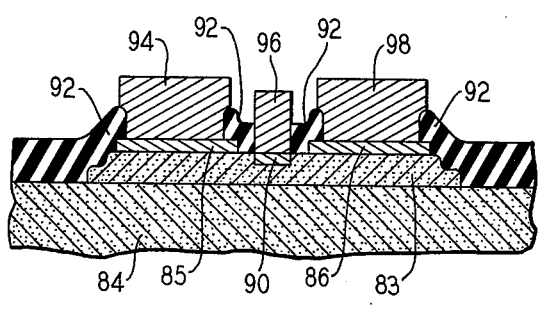

The final metallization process outlined above will be specified with reference to the simplified showing of FIG. 9 and subsequent similar figures. The steps in this process are as follows:

1. Coat the entire top surface of the FIG. 9 device with a 0.9-micrometer-thick layer of COP.
2. With EBES, expose the entire surface of the COP layer except for those portions that overlie the source, drain and gate electrodes, and the gate and drain bus bars and bonding pads. Remove the unexposed COP.
3. With the patterned COP as a mask, remove the uncovered silicon dioxide in a $CF_4$ plasma etching step.
4. Remove the COP mask in an $O_2$ plasma etching step. At this point the electrode configuration of the aforementioned simplified device may be represented as shown in FIG. 10. Again, the GaAs substrate member 84, the mesa 83, the source electrode 85, the drain electrode 86 and the gate electrode 90 are shown. In addition, the silicon dioxide portions that remain after the aforedescribed patterning step are designated in FIG. 10 by reference numerals 92.
5. Deposit the following metallic layers in order on the entire top surface of the FIG. 10 device: a 1500-Angstrom-unit-thick layer of titanium, a 1000-Angstrom-unit-thick layer of platinum, a 1-micrometer-thick layer of gold and a 2000-Angstrom-unit-thick layer of titanium.
6. Deposit a 3000-Angstrom-unit-thick layer of silicon dioxide on top of the aforerecited metallic layer.
7. Coat the silicon dioxide layer with a 0.7-micrometer-thick layer of COP.
8. With EBES, expose only those portions of the COP layer that overlie the source, drain and gate electrodes and the gate, drain and source bus bars and bonding pads. Remove the unexposed COP.
9. Pattern the top silicon dioxide layer in a $CF_4$ plasma etching step using the patterned COP layer as a mask.
10. Pattern the top titanium layer in an $O_2$ plasma etching step (in the presence of a fluorine species and at a temperature in excess of 100° C.) using the patterned silicon dioxide layer as a mask.
11. Ion mill the entire top surface of the device using the top titanium and silicon dioxide layers as a milling mask. This will remove those portions of the gold and platinum layers that are not covered with titanium. The bottom 1500-Angstrom-unit-thick layer of titanium acts as an ion milling stop.
12. Remove the patterned top layer of silicon dioxide in a $CF_4$ plasma etching step.
13. Remove the top and bottom titanium layers by etching in buffered hydrofluoric acid. FIG. 11 represents the device at that point in the fabrication sequence. In FIG. 11 each of the metallic regions 94, 96 and 98 actually comprises three layers made of titanium, platinum and gold, respectively, as specified above. The metallic regions 94, 96 and 98 make good ohmic contact with the originally deposited source, gate and drain members 85, 90 and 86, respectively.
14. For protective purposes, cover the entire top surface of the device with a 5000-Angstrom-unit-thick layer of silicon dioxide.
15. By means of the lithographic techniques described above, form openings in the silicon dioxide layer in registry with the source, drain and gate bonding pads.
16. Form electrical connections between the bonding pads and external terminals in a standard device package.

Thus, there has been described herein a particular illustrative fabrication sequence for making an integrated multiple-gate GaAs FET device. The specified device is characterized by a unique and advantageous cross-under design and is made in microminiature form by directly processing a wafer using electron-beam lithographic techniques.

Finally, it is to be understood that the above-described arrangements and procedures are only illustrative of the application of the principles of the present invention. In accordance with those principles, numerous other structural configurations and processing techniques may be devised by those skilled in the art without departing from the spirit and scope of the invention.

What is claimed is:

1. In combination in a high-power microminiature gallium arsenide field-effect-transistor device, a gallium arsenide substrate having an epitaxial mesa formed thereon, multiple interleaved source, gate and drain electrodes formed on said mesa, each of said electrodes including a portion that extends beyond one edge or the opposite edge of the mesa and onto said substrate, a drain bus bar on said substrate adjacent said one edge of said mesa connecting together said drain electrodes, a gate bus bar, including cross-under fingers, on said substrate adjacent the opposite edge of said mesa connecting together said gate electrodes, insulating portions disposed on selected regions of said cross-under fingers, and a source bus bar on said substrate adjacent said opposite edge of said mesa extending over the insulating portions on said cross-under fingers to connect together said source electrodes, wherein said cross-under fingers are respectively deposited in convex-bottom channels formed in said substrate, each of said fingers comprising, in order of deposition, layers of germanium/gold, silver, gold and tungsten.

2. A combination as in claim 1 wherein said insulating portions are made of silicon dioxide.

3. A multiple-gate GaAs FET device comprising at least one mesa formed on a GaAs substrate member, plural interleaved source, drain and gate electrodes on each mesa with the ends of said electrodes extending onto said substrate member, a drain bus bar including at least one bonding pad on said substrate member, said drain bus bar electrically connecting together corresponding ends of said drain electrodes, a gate bus bar including at least one bonding pad on said substrate member and having cross-under members on said substrate member to electrically connect together corresponding ends of said gate electrodes, and a source bus bar including at least one bonding pad on said substrate member, said source bus bar crossing over said cross-under members and electrically insulated therefrom to electrically connect together corresponding ends of said source electrodes, wherein said cross-under members are respectively deposited in convex-bottom trenches formed in said substrate member, each of said members comprising, in order, deposited layers of germanium/gold, silver, gold and tungsten.

4. A device as in claim 3 wherein a layer of silicon dioxide overlies said tungsten layer in those regions wherein said source bus bar crosses over said cross-under members.

* * * * *